US007589591B2

(12) United States Patent
Eggermont

(10) Patent No.: US 7,589,591 B2
(45) Date of Patent: Sep. 15, 2009

(54) DIFFERENTIAL SENSING WITH HIGH COMMON MODE REJECTION

(75) Inventor: Jean-Paul Eggermont, Lincent (BE)

(73) Assignee: Semiconductor Components Industries, LLC, Phoenix, AZ (US)

(*) Notice: Subject to any disclaimer, the term of this patent is extended or adjusted under 35 U.S.C. 154(b) by 80 days.

(21) Appl. No.: 11/841,627

(22) Filed: Aug. 20, 2007

(65) Prior Publication Data
US 2009/0051433 A1 Feb. 26, 2009

(51) Int. Cl.
*H03F 3/45* (2006.01)
(52) U.S. Cl. ..................................................... 330/258
(58) Field of Classification Search .................. 330/69, 330/258
See application file for complete search history.

(56) References Cited

U.S. PATENT DOCUMENTS

| 4,769,590 | A | 9/1988 | Taylor |
| 6,504,404 | B2 | 1/2003 | Uchiki et al. |
| 6,819,170 | B1 | 11/2004 | Kindt |
| 6,897,731 | B2 * | 5/2005 | Zhang et al. ................ 330/298 |
| 7,205,833 | B2 * | 4/2007 | Burt et al. ...................... 330/69 |
| 7,221,190 | B2 | 5/2007 | Partow et al. |

FOREIGN PATENT DOCUMENTS

WO    WO02069149    9/2002

OTHER PUBLICATIONS

European Patent Office, Communication, European Search Report, mailed Dec. 19, 2008, 6 pages.

* cited by examiner

*Primary Examiner*—Khanh V Nguyen
(74) *Attorney, Agent, or Firm*—Workman Nydegger

(57) ABSTRACT

A differential operation circuit that uses the differential input signals to generate a reference voltage that fluctuates with the common mode voltage of the differential input signals. The reference voltage includes a common mode component that generally follows the common mode voltage of the differential input signals. The common mode component of the reference voltage is used to fully or almost fully offset the common mode voltage of the differential input signals, thereby increasing the differential operation circuit's common mode rejection characteristics.

18 Claims, 8 Drawing Sheets

DIFFERENTIAL SENSING WITH HIGH COMMON MODE REJECTION

BACKGROUND

A differential circuit operates using a differential input voltage defined the difference between two input voltage (referred to herein as Vin1 and Vin2). Ideally, for some differential circuits, the circuit should operate based on the difference in the input voltages (Vin1−Vin2) regardless of the common mode level of the input voltages. The "common mode voltage" (potentially also referred to as "VCM" hereinafter) is defined as the average at any given time of the input voltages (i.e., (Vin1+Vin2)/2). The differential mode voltage for each of the inputs is defined as the difference between the input voltage and the common mode voltage (e.g., Vin1−VCM, or VCM−Vin2).

As a practical matter, however, the operation of a typical differential circuit will depend on the common mode voltage. If the common mode voltage were to vary outside of a given range, the differential circuit might not operate at all. Such circuits may obtain more stable performance, therefore, by keeping the common mode voltage stable. However, this is not always practical either. In fact, in some operational environments, common mode voltage may vary by several orders of magnitude more than the differential mode voltage.

Accordingly, if the common mode voltage varies unpredictably, the differential circuit may consequently have some unpredictable operational component. The variation of common mode voltage is often termed "common mode noise". The ability of a circuit to adjust for common mode variations without affecting the circuit's operation is often measured in terms of a "common mode rejection ratio".

To increase a circuit's common mode rejection ratio, some circuits have components that compensate for common mode voltage. One typical way to do this is to use a feedback loop. However, the feedback loop typically has limited bandwidth. If the frequency of the common mode voltage is above a certain threshold, the common mode rejection may become significantly weakened.

BRIEF SUMMARY

Embodiments described herein relate to a differential operation circuit or its operation. The differential operating circuit uses the differential input signals to generate a reference voltage that fluctuates with the common mode voltage of the differential input signals. The reference voltage and a first differential input signal are provided as inputs to a first differential output signal generation circuit that uses the common mode components of its input signals to generate a first differential output signal with reduced common mode noise. The reference voltage and a second differential input signal are provided as inputs to a second differential output signal generation circuit that also uses the common mode components of its input signals to generate a second differential output signal with reduced common mode noise. If the common mode components of the input signals to the differential output signal generation circuits are made to follow each other, the common mode component of the differential output signals may be significantly reduced by potentially orders of magnitude.

Additional embodiments will be set forth in the description that follows, and in part will be obvious from the description, or may be learned by the practice of the invention. The embodiments of the invention may be realized and obtained by means of the instruments and combinations particularly pointed out in the appended claims. These and other embodiments of the present invention will become more fully apparent from the following description and appended claims, or may be learned by the practice of embodiments of the invention as set forth hereinafter.

BRIEF DESCRIPTION OF THE SEVERAL VIEWS OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Embodiments of the present invention relate to a differential operation circuit that uses the differential input signals to generate a reference voltage that fluctuates with the common mode voltage of the differential input signals. The reference voltage includes a common mode component that generally follows the common mode voltage of the differential input signals. The common mode component of the reference voltage is used to fully or almost fully offset the common mode voltage of the differential input signals, thereby increasing the differential operation circuit's common mode rejection characteristics.

Figure 3:
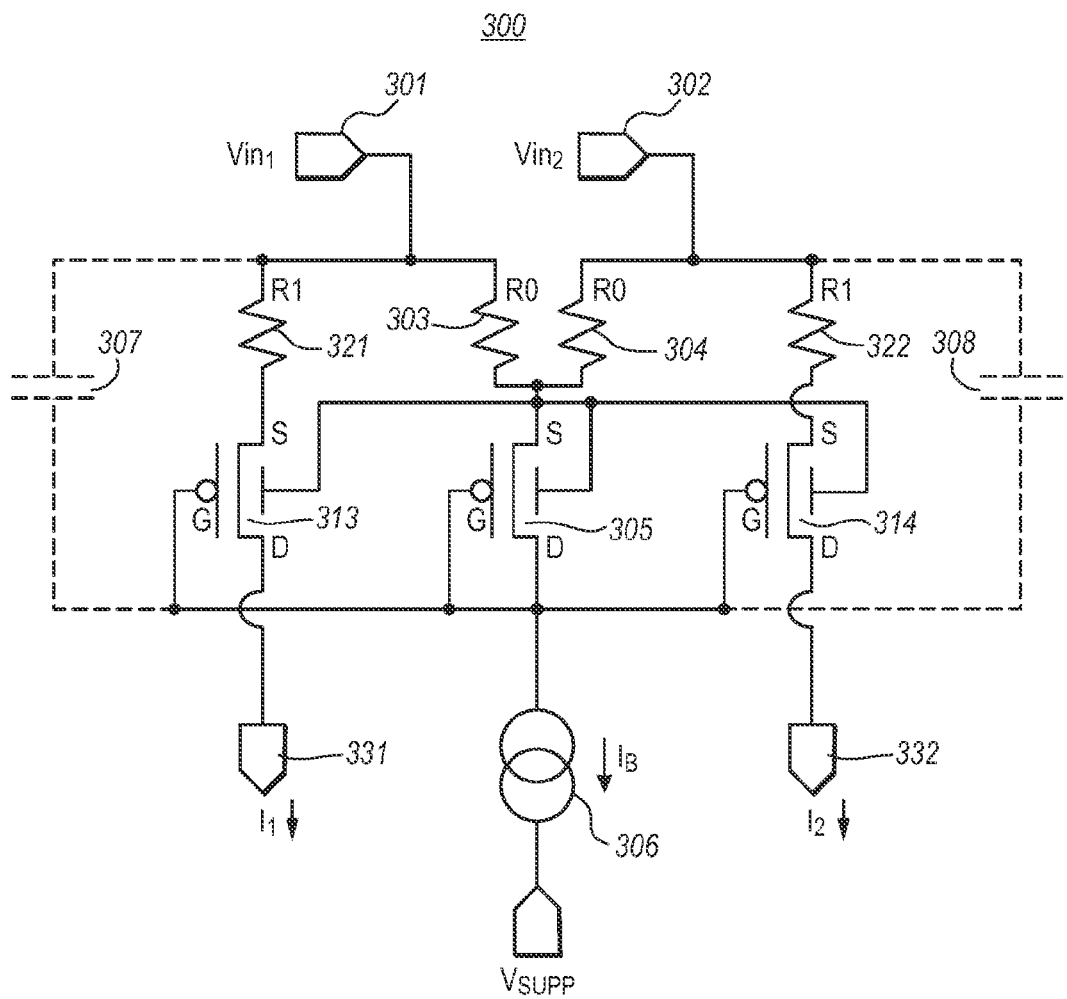
FIG. 3 illustrates a pMOS transistor implemented embodiment of the differential operation circuit of FIG. 1.
Figure 4:
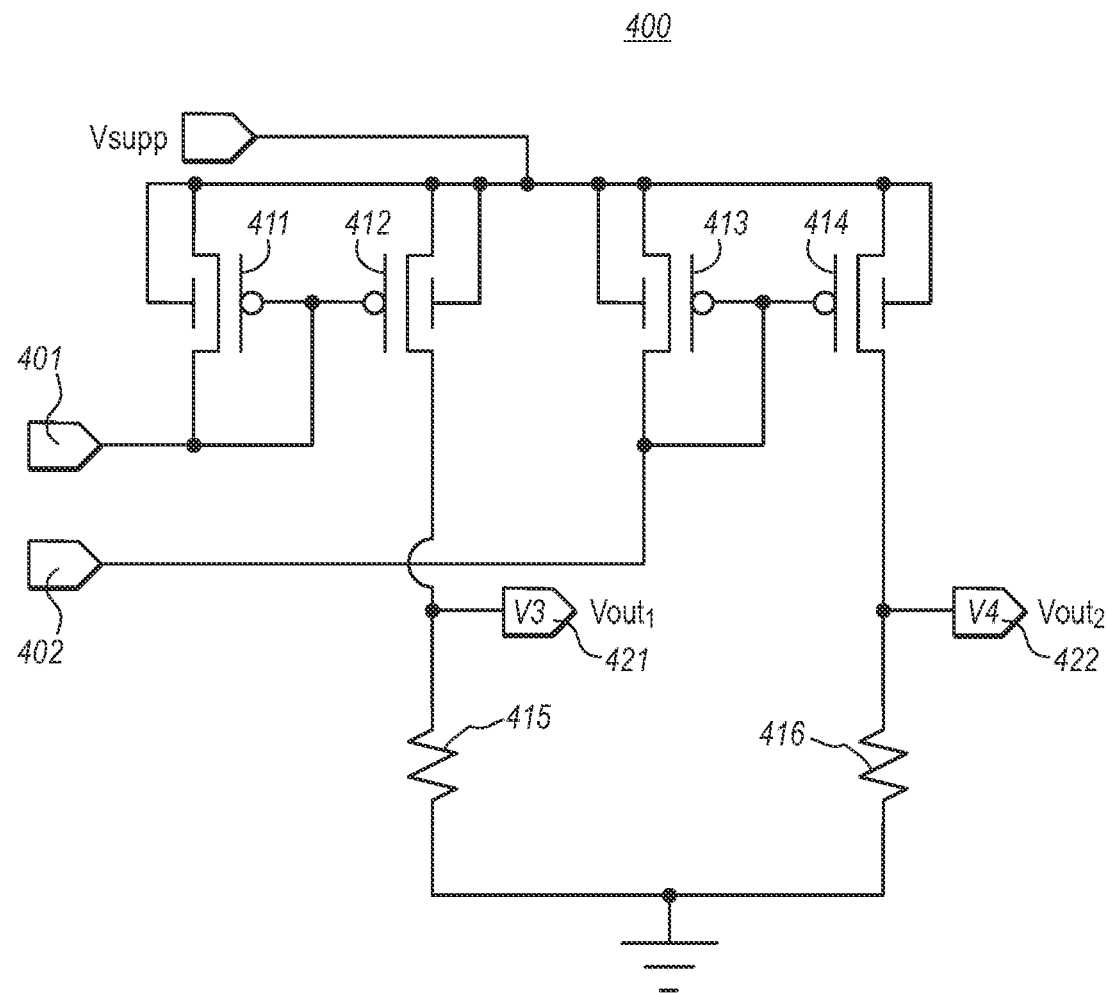
FIG. 4 illustrates a current-voltage converter that may be used with the differential operation circuits of FIGS. 2 and 3 to convert the output from a differential current signal to a differential voltage signal.
Figure 5:
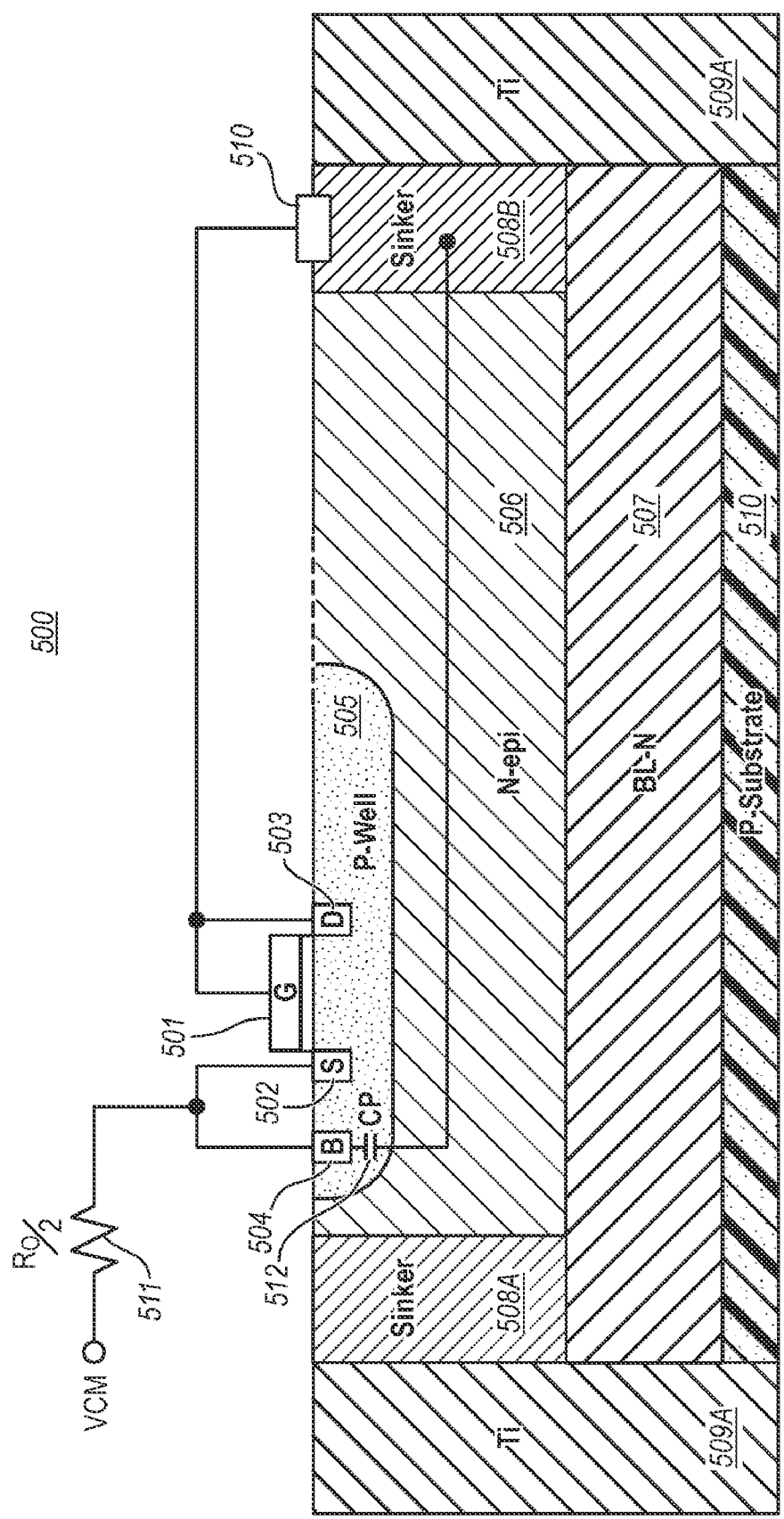
FIG. 5 illustrates a cross-sectional view of a transistor set within a pocket that reduces parasitic capacitance of the transistor.
Figure 6:
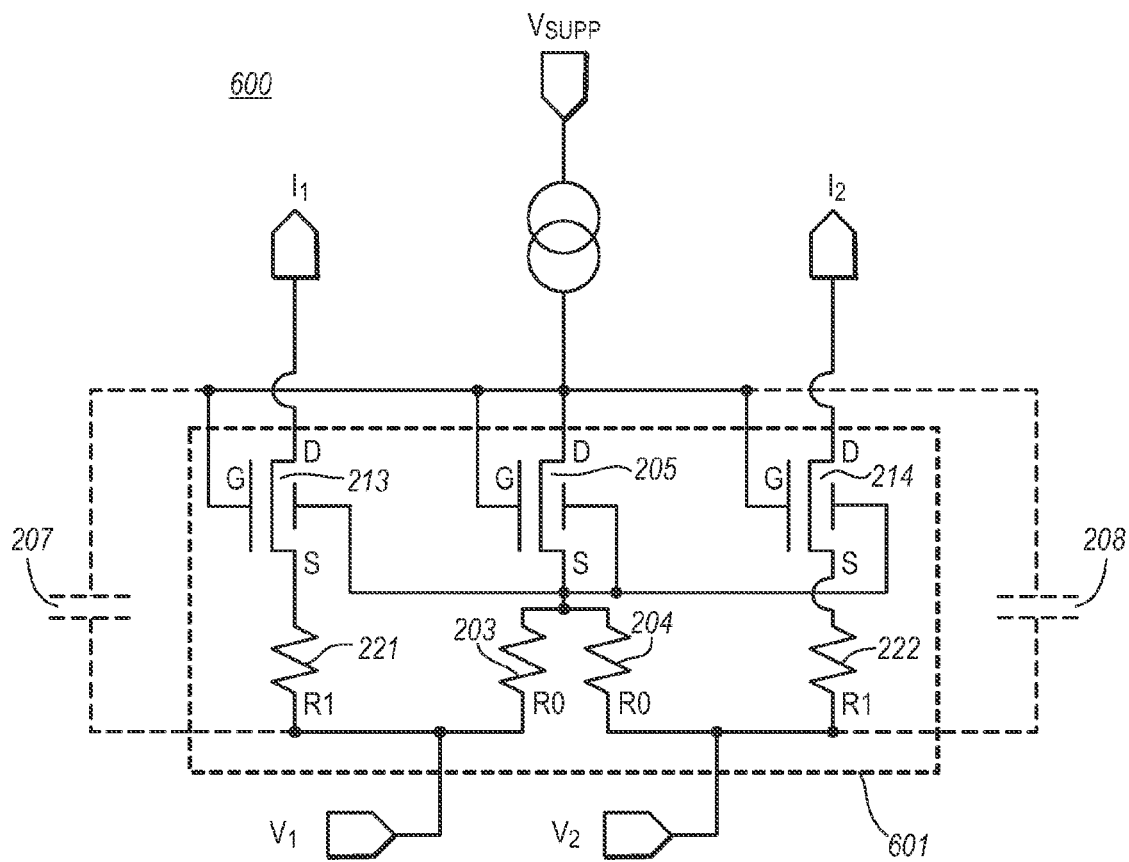
FIG. 6 illustrates how the pocket might be configured in the context of the circuit of FIG. 2.

First, an embodiment will be described with respect to FIG. 1. Then, several more specific embodiments of a differential operation circuit will be described with respect to FIGS. 2 and 3. FIG. 4 will then be described, which illustrates a current-voltage converter that may be used with the differential operations circuits of FIGS. 2 and 3 to convert the output from a differential current signal to a differential voltage signal. FIGS. 5 and 6 will then be used to describe the use of a pocket that may reduce the parasitic capacitances of the transistors of FIGS. 2 and 3 to thereby allow for common mode rejection at higher frequencies. Finally, further improvements will be described with respect to FIGS. 7 and 8.

Figure 1:
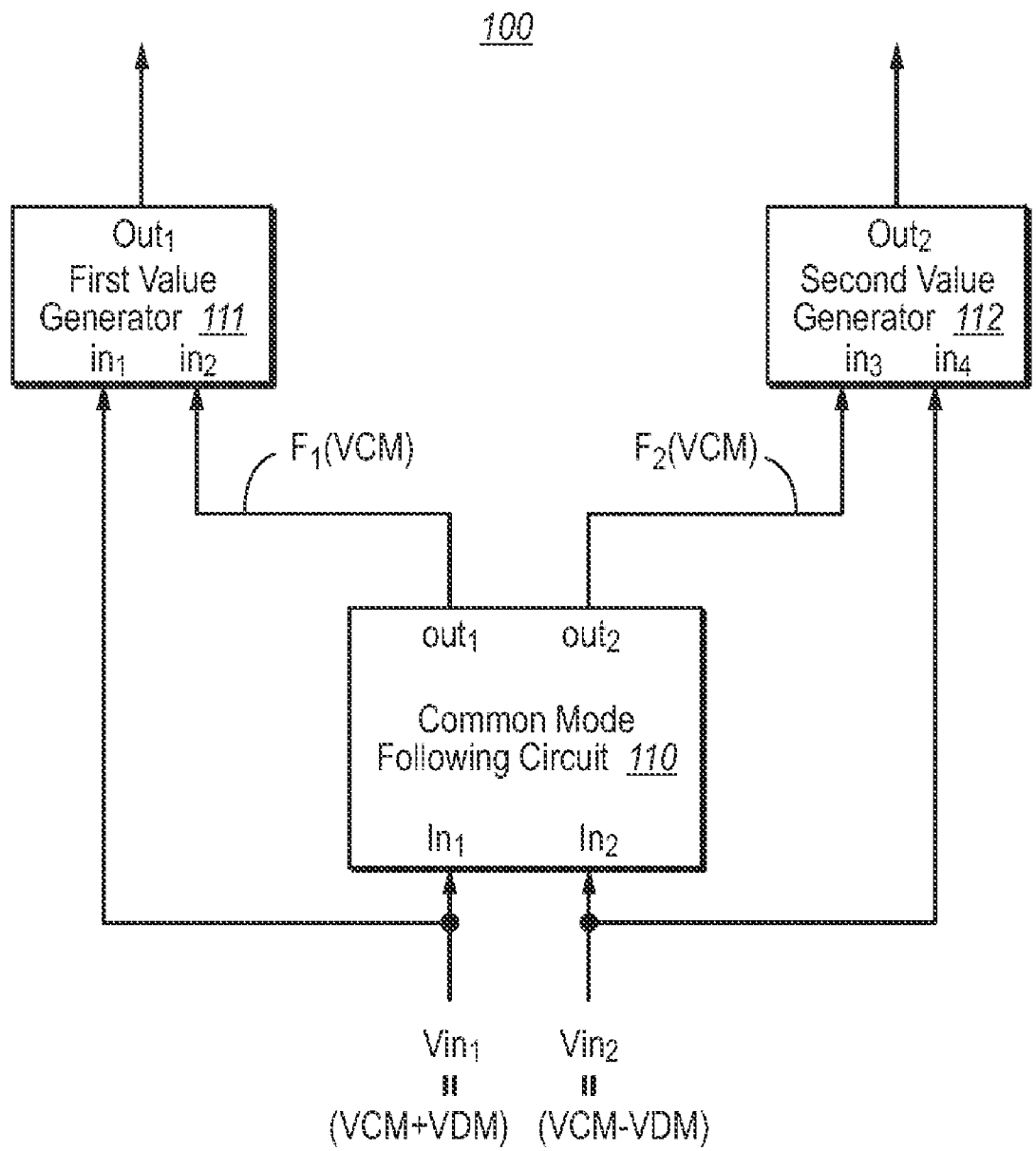
FIG. 1 schematically illustrates a differential operation circuit that includes a common mode following circuit that generates reference signal(s) that follows the common mode of the differential input signals; and differential output signal generators that use this reference voltage to partially or fully offset the common mode components of the differential input signals.

FIG. 1 schematically illustrates a differential operation circuit 100 in accordance with one embodiment of the invention. The differential operation circuit 100 includes two differential input nodes for receiving two differential input signals called herein Vin1 and Vin2. The common mode voltage (VCM) of two differential input signals is defined as the average of the differential input signals as may be expressed in the following Equation (1).

$$VCM = (Vin1 + Vin2)/2 \quad (1)$$

The differential mode voltage (VDM) is the voltage that each input signal varies from the common mode voltage (VCM). For instance, Equation (2A) defines the differential mode voltage (VDM) in terms of the differential input voltages Vin1, Vin2, and VCM; whereas Equation (2B) shows an equivalent expression for the differential mode voltage (VDM) in terms of just Vin1 and Vin2.

$$VDM = Vin1 - VCM = VCM - Vin2 \quad (2A)$$

$$VDM = (Vin1 - Vin2)/2 \quad (2B)$$

A common mode following circuit 110 receives the first and second differential input signals Vin1 and Vin2, and generates one or more reference signals that track the common mode voltage VCM of the differential input signals. For instance, common mode following circuit 110 is illustrated as receiving first input signal Vin1 at input terminal In1, and as receiving second input signal Vin2 at input terminal In2. The common mode following circuit 110 tracks the common mode voltage by generating a reference signal that is a function F(VCM) of the common mode voltage VCM.

Figure 2:
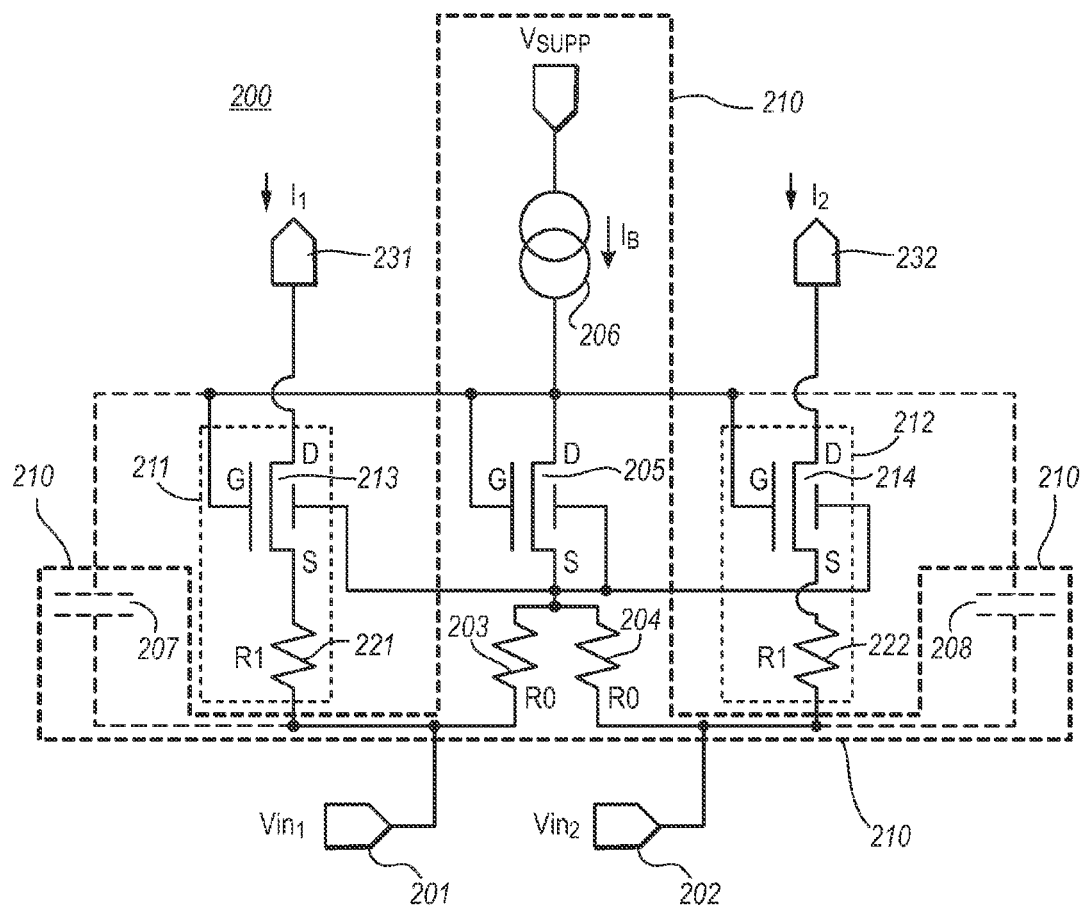
FIG. 2 illustrates an nMOS transistor implemented embodiment of the differential operation circuit of FIG. 1.

In FIG. 1, the common mode following circuit 110 is illustrated as generating two reference signals $F_1(VCM)$ and $F_2(VCM)$ on respective output nodes out1 and out2. However, the functions $F_1(x)$ and $F_2(x)$ may be the same function, implying that the common mode following circuit 110 outputs a single reference voltage. In the example of FIGS. 2 and 3, the common mode following circuit generates a reference voltage that linearly tracks the common mode voltage. For instance, the reference voltage might be approximated by the following Equation (3).

$$k_1 \times VCM + k_2 \quad (3)$$

where $k_1$ is a constant that defines the degree to which the reference voltage tracks the common mode voltage VCM, and where $k_2$ is a constant defining the offset of the tracking (and may even be zero).

In another embodiment, the reference voltage may follow in equal proportion the common mode voltage (in which case, $k_1$ of Equation 3 would be unity). For instance, the reference voltage might approximately follow the common mode voltage with an accuracy of within 1% (0.99<k1<1.01), within 0.1% (0.999<k1<1.001), or even within 0.01% (0.9999<k1<1.0001).

The common mode tracking reference voltage may then be used by other components of the differential operation circuit to perform an appropriate differential operation that has high common mode rejection. For instance, in the examples described with respect to FIGS. 2 and 3, the differential operation is differential amplification. However, the principles described herein may be applied to reduce common mode noise for any differential operation.

For instance, the differential operation circuit 100 includes a first differential output signal generation circuit 111 and a second differential output signal generation circuit 112 (illustrated as first value generator 111, and second value generator 112, respectively). The first differential output signal generation circuit 111 generates a first output signal (on output terminal Out1) with reduced common mode noise using as inputs 1) at least a derivative of the first signal Vin1 received from the first differential input node and received at input terminal in1, and 2) at least a derivative of the reference voltage $F_1(VCM)$ generated by the common mode following circuit 110 and received at input terminal in2. The second differential output signal generation circuit 112 generates a second output signal (on output terminal Out2) with reduced common mode noise using as inputs 1) at least a derivative of the second signal Vin2 received from the second differential input node and received at input terminal in3, and 2) at least a derivative of the reference voltage $F_2(VCM)$ generated by the common mode following circuit 110 and received at input terminal in4. Once again, recall that the function $F_1(x)$ may be the same as the function $F_2(x)$, in which case, the same signal is received at terminals in2 and in3.

Regarding a brief note on the nomenclature of FIG. 1, input terminals In1 and In2, and output terminals Out1 and Out2, of the entire differential operation circuit 100 are identified by capitalization of the terminal name, whereas other internal terminals out1, out2, in1, in2, in3 and in4 of the differential operation circuit 100 are identified without being capitalized. In this description and in the claims, the term "terminal" is to be construed broadly as being any circuit node, and does not require that the terminal have the capability of being probed, or being otherwise accessible from outside the circuit. Indeed, the differential operation circuit 100 may, but need not, be a part of a larger integrated circuit.

FIG. 2 illustrates an nMOS transistor implemented differential operation circuit 200 that represents a specific embodiment of the differential operation circuit 100 of FIG. 1. The differential operation circuit 200 performs amplification of differential voltage input signals (Vin1 and Vin2) provided on differential input nodes 201 and 202, and asserts corresponding different current output signal (I1 and I2) on differential output nodes 231 and 232.

A current source 206 is coupled to a high supply voltage $V_{SUPP}$ so as to supply a relatively stable bias current $I_B$. The bias current $I_B$ passes through the channel region of nMOS transistor 205. The first resistor 203 is connected between the first differential input node 201 and the source terminal of the transistor 205. The second resistor 204 is connected between the second differential input node 202 and the source terminal of the transistor 205. Accordingly, the bias current $I_B$ is divided to pass through either the resistor 203 and into the differential input node 201 or through the resistor 204 and into the differential input node 202. In this state, assuming that the resistance of both resistors 203 and 204 is the same (R0), the voltage (VS0) at the source of the transistor 205 will be defined by the following Equation (4).

$$VS0 = [(R0 \times I_B)/2] + VCM \quad (4)$$

The term $[(R0 \times I_B)/2]$ is a constant. Accordingly, the source voltage VS0 of transistor 205 will follow the common mode voltage VCM with some fixed offset. The source terminal of the transistor 205 is connected to the bulk terminal of both nMOS transistors 213 and 214 to thereby provide a voltage that follows the common mode voltage to the bulk terminals of the amplifying nMOS transistors 213 and 214.

The voltage at the drain terminal of the nMOS transistor 205 will be approximately equal to the source voltage VS0, plus one voltage drop, since the nMOS transistor 205 is coupled in diode-configuration, with its gate and drain terminals connected. Accordingly, the drain terminal of the nMOS transistor 205 also follows the common mode voltage VCM. In one alternative embodiment, the diode-connected nMOS transistor 205 may be replaced with any forward-biased diode between the bias current source 206 and the parallel combination of resistors 203 and 204.

The gate terminals of the amplifying nMOS transistors 213 and 214 are also connected to the gate and drain terminals of the nMOS transistor 205. Accordingly, the gate voltage of the amplifying nMOS transistor 213 and 214 also follows the common mode voltage with some fixed offset.

The combination of the bias current source 206, the nMOS transistor 205, and resistors 203 and 204 configured as shown in FIG. 2, is thus a specific embodiment 210 of the more general common mode following circuit 110 of FIG. 1. The common mode following circuit example of FIG. 2 thus provides stable voltage references that follow the common mode when the resistors 203 and 204 are matched.

As it turns out, the common mode following circuit of FIG. 2 is not sensitive to mismatches between the resistors 203 and 204. Computationally, this may be demonstrated by using the term R0 defined for Equation 4 above. In Equation 4, it was assumed that R0 is the resistance of each of the resistors 203 and 204. Suppose instead that R0 is simply stated to be equal to twice the parallel resistance of resistors 203 and 204 (i.e., R0=(R203∥R204)*2). If the resistance of the resistor 203 (i.e., R203) and the resistance of the resistor 204 (i.e., R204) were the same, then R0 becomes simply equal to R203 and 204. However, if the resistances R203 and R204 are not the same, the R0 is not equal to the resistances R203 and R204. In other words, we have now removed the constraint that the resistance of resistor 203 (R203) and the resistance of the resistor 204 (R204) are equal. Given any particular value for R203 and R204, the term R0 is still constant (since R203 and R204 remain constant though at values different than each other). Accordingly, given any particular value for R203 and R204, the term [(R0×$I_B$)/2] of Equation 4 remains constant. Accordingly, according to Equation 4, the source voltage VS0 will track the common mode voltage VCM regardless of whether the resistors 203 and 204 are matched.

As for the first amplifying nMOS transistor 213, as previously discussed, its bulk and gate terminals have voltages that follow the common mode voltage VCM. The source terminal of the nMOS transistor 213 is coupled through resistor 221 to the first differential input node 201. The drain terminal of the nMOS transistor 213 is coupled to the first differential current output terminal 231. The current I1 represents a first current signal that is the first differential output signal of the differential operation circuit 200. The first amplifying nMOS transistor 213 coupled with the resistor 221 represents a specific example 211 of the first differential output signal generation circuit 111 of FIG. 1.

Similarly, as for the second amplifying nMOS transistor 214, its bulk and gate terminals have voltages that follow the common mode voltage VCM. The source terminal of the nMOS transistor 214 is coupled through resistor 222 to the second differential input node 202. The drain terminal of the nMOS transistor 214 is coupled to the second differential current output terminal 232. The current I2 represents a second current signal that is the second differential output signal of the differential operation circuit 200. The first amplifying nMOS transistor 213 coupled with the resistor 222 represents a specific example 212 of the first differential output signal generation circuit 112 of FIG. 1. The resistors 221 and 222 may be matched with resistance RI, but even if they of somewhat mismatched, the circuit 200 still operates with a high common mode rejection characteristics. The transistor 205 may be sized larger than the transistors 213 and 214 if desired.

The current through the drain terminals of transistors 213 and 214 represents the differential output current signal of the differential operation circuit 200. The differential output signal has limited, if any, relation to the common mode voltage VCM as will now be demonstrated through various equations.

With respect to transistor 213, the source voltage VS1 is defined by Equation 5 as follows:

$$VS1=Vin1+R1\times I1 \quad (5)$$

where R1 is the resistance of each of the resistors 221 and 222; and where I1 is the first differential output current signal.

The transistor 213 is operating in saturation mode. In this case, the current through the channel region of transistor 213 (i.e., I1) may be defined by Equation 6 as follows:

$$I1=K(W/L)_1 [VGS1-VT]^2 (1+\lambda VDS1) \quad (6)$$

where K is the technological gain of the considered nMOS transistor;

W is the active region width of the nMOS transistor;

L is the active region length of the nMOS transistor;

VGS1 is the gate to source voltage of the nMOS transistor;

VDS1 is the drain to source voltage of the nMOS transistor; and

λ is the channel length modulation parameter (in a first instance, the channel length modulation parameter λ is neglected).

The term VGS1 may be represented by the following Equation 7 as follows:

$$VGS1=VG1-VS1 \quad (7)$$

where VG1 is the gate voltage of the transistor 213.

Substituting the VS1 value from Equation 5 into Equation 7 yields the following Equation 8:

$$VGS1=VG1-Vin1-R1\times I1 \quad (8)$$

Furthermore, realizing that the gate voltage VG0 of the transistor 205 is the same as the gate voltage VG1 of the transistor 213 permits Equation 8 to be modified to the following Equation 9:

$$VGS1=VG0-Vin1-R1\times I1 \quad (9)$$

Furthermore, since Vin1 is equal to VCM+VDM, Equation 9 may be modified to the following Equation 10:

$$VGS1=VG0-VCM-VDM-R1\times I1 \quad (10)$$

The drain voltage VD0 of the transistor 205 may be expressed in terms of the gate voltage VG0 of the transistor 205 using the following Equation (11):

$$VG0=VD0=VS0+VT+SQRT(L0/W0/K*IB) \quad (11)$$

Where VT is the threshold voltage of transistor 205;

L0 is the length of the active region of the transistor 205; and

W0 is the width of the active region of the transistor 205.

Substituting Equation 11 into Equation 10 yields the following Equation 12:

$$VGS1=VS0+VT+SQRT(L0/W0/K*IB)-VCM-VDM-R1\times I1 \quad (12)$$

Substituting Equation 4 into Equation 12 yields the following Equation 13:

$$VGS1 = \tfrac{1}{2} R0 \times I_B + VCM + VT + SQRT(L0/W0/K*IB) - VCM - VDM - R1 \times I1 \qquad (13)$$

Which reduces to the following Equation 14:

$$VGS1 = \tfrac{1}{2} R0 \times I_B + VT + SQRT(L0/W0/K*IB) - VDM - R1 \times I1 \qquad (14)$$

Accordingly, the output current I1 is shown to be relatively independent of the common mode voltage. A similar derivation might be provided to shown that the current I2 is relatively independent of the common mode voltage. Accordingly, the differential operation circuit 200 has high common mode rejection characteristics.

As a practical matter, however, at some point at high frequency for common mode voltage, the frequency response characteristics of the transistor 205 (effected by, for example, parasitic capacitances in the transistor 205) may cause the reference voltage generated by the transistor 205 to lose tracking with the common mode voltage. The frequency at which this occurs may be increased by placing the transistor 205 in a pocket as described further with respect to FIGS. 5 and 6. Additionally, capacitors 207 and 208 may be provided to allow for better common mode voltage tracking at even higher frequencies of the common mode voltage. The capacitors 207 and 208 are each coupled between a corresponding differential input node 201 and 202, and the drain terminal of transistor 205. The capacitors 207 and 208 may each be single capacitors, or may be even a bank of programmable capacitors to allow for fine tuning of the VCM tracking characteristics of the transistor 205. The capacitors 207 and 208 may also be included within the common mode following circuit 210.

FIG. 3 illustrates a pMOS transistor implemented embodiment 300 of the differential operation circuit of FIG. 1. The differential operation circuit 300 of FIG. 3 is similar to the differential operation circuit 200 of FIG. 2, except that all nMOS transistors 213, 205 and 214 of FIG. 2, are replaced by corresponding pMOS transistors 313, 305 and 314. Furthermore, the current source 206 (which is coupled to a high supply voltage to supply current to the channel region of the nMOS transistor 205) is exchanged with a current sink 306 (which is coupled to a low supply voltage to draw current from the channel region of the pMOS transistor 305). Resistors 321, 303, 304, and 322 of FIG. 3 may be similar to the corresponding resistors 221, 203, 204 and 222 of FIG. 2. Likewise, capacitors 307 and 308 of FIG. 3 may be similar to the corresponding capacitors 207 and 208 of FIG. 3. The differential operation circuit 300 of FIG. 3 may operate similar to the differential operation circuit 200 of FIG. 2 by receiving a differential input signal Vin1 and Vin2 on input nodes 301 and 302, and providing a corresponding differential output signal I1 and I2 on differential output nodes 331 and 332.

FIG. 4 illustrates a current-voltage converter 400 that may be used with the differential operation circuits of FIGS. 2 and 3 to convert the output from a differential current signal to a differential voltage signal. The current-converter 400 is a conventional converter that includes pMOS transistors 411 through 414. The input terminals 401 and 402 may receive signals I1 and I2 generated by either of the differential operation circuits 200 and 300. The current I1 is provided through the channel region of transistor 41 1, where it is mirrored through the channel region of transistor 412. The resistor 415 configured as shown with the differential voltage output terminal 421 positioned between the transistor 412 and the resistor 415 converts this current into a proportionate voltage Vout1 applied to the differential voltage output terminal 421. Similarly, the current I2 is provided through the channel region of transistor 413, where it is mirrored through the channel region of transistor 414. The resistor 416 configured as shown with the differential voltage output terminal 422 positioned therebetween converts this current into a proportionate voltage Vout2 applied to the differential voltage output terminal 422.

Accordingly, a differential operation circuit with increased common mode rejection characteristics is described. The differential operation circuit has high bandwidth. However, to improve bandwidth even further, a pocket may be used to reduce the parasitic capacitances of the various transistors.

FIG. 5 illustrates a cross-sectional view 500 of a transistor set within a pocket that reduces parasitic capacitance. FIG. 5 illustrates the gate terminal region 501, the source terminal region 502, the drain terminal region 503 and the bulk terminal region 504 of one embodiment of the transistor 205 of FIG. 2. As shown in FIG. 2, the source and bulk of the transistor 205 are coupled to each other. Accordingly, in FIG. 5, the bulk region 504 and the source region 502 are shown electrically coupled. FIG. 5 shows a circuit equivalent of the situation of FIG. 2 in which the bulk and source terminals of the transistor 205 are coupled through parallel resistors to the differential input nodes. This equivalent is represented in FIG. 5 by the bulk terminal region 504 and the source terminal region 502 being coupled through resistor 511 (R0/2) to a common mode voltage VCM.

Without a pocket, parasitic capacitance may allow some of the common mode to creep back into the differential operation, since there would be some parasitic capacitance between the bulk and source regions 504 and 502 and the substrate. Accordingly, the parasitic capacitance forms a low-pass filter. In other words, at higher and higher frequencies, the source voltage does not strictly follow the common mode anymore.

The further features of FIG. 5, however, demonstrate how the parasitic capacitor problem may be solved using floating pocket technology. A pocket of silicon (e.g an N-epi pocket 506 or n-type epitaxial pocket) is isolated from a substrate 510 of opposite carrier type (p-substrate). Isolation is realized with trench isolation (TI) 509A and 509B. The n-epi pocket may be biased through sinkers 508A and 508B and BLN (buried layer type N) 507. The transistor is formed in a p-well 505, the p-well itself formed in the n-epi pocket 506. One electrode of the parasitic capacitor CP is at the bulk region 504 and source region 502 and the other is at the N-epi/Pocket contact electrode 510.

By shorting the drain region 503 of the transistor with the N-epi/Pocket contact electrode 510, one will keep the voltage drop across parasitic capacitor CP constant. Hence, the parasitic capacitor will not be charged or discharged by voltage variations at the bulk/source electrode. Therefore, the parasitic capacitor CP will not have any low pass filtering effect. Optionally, the drain terminals of the other transistors 213 and 214 may also be shorted to the pocket contact electrode 510, although not shown in FIG. 5. In addition, the transistors 213 and 214 may each be placed within the same p-well 505 within the same n-epi layer 506 as the transistor 205.

FIG. 6 illustrates how the pocket might be configured in the context of the circuit of FIG. 2. The differential operation circuit 600 is the same as the differential operation circuit 200 of FIG. 2, except that the pocket 601 is shown encompassing transistors 213, 205 and 214, and resistors 221, 203, 204 and 222. Accordingly, the pocket may further improve the common mode rejection characteristics of the differential operation circuit.

Figure 7:
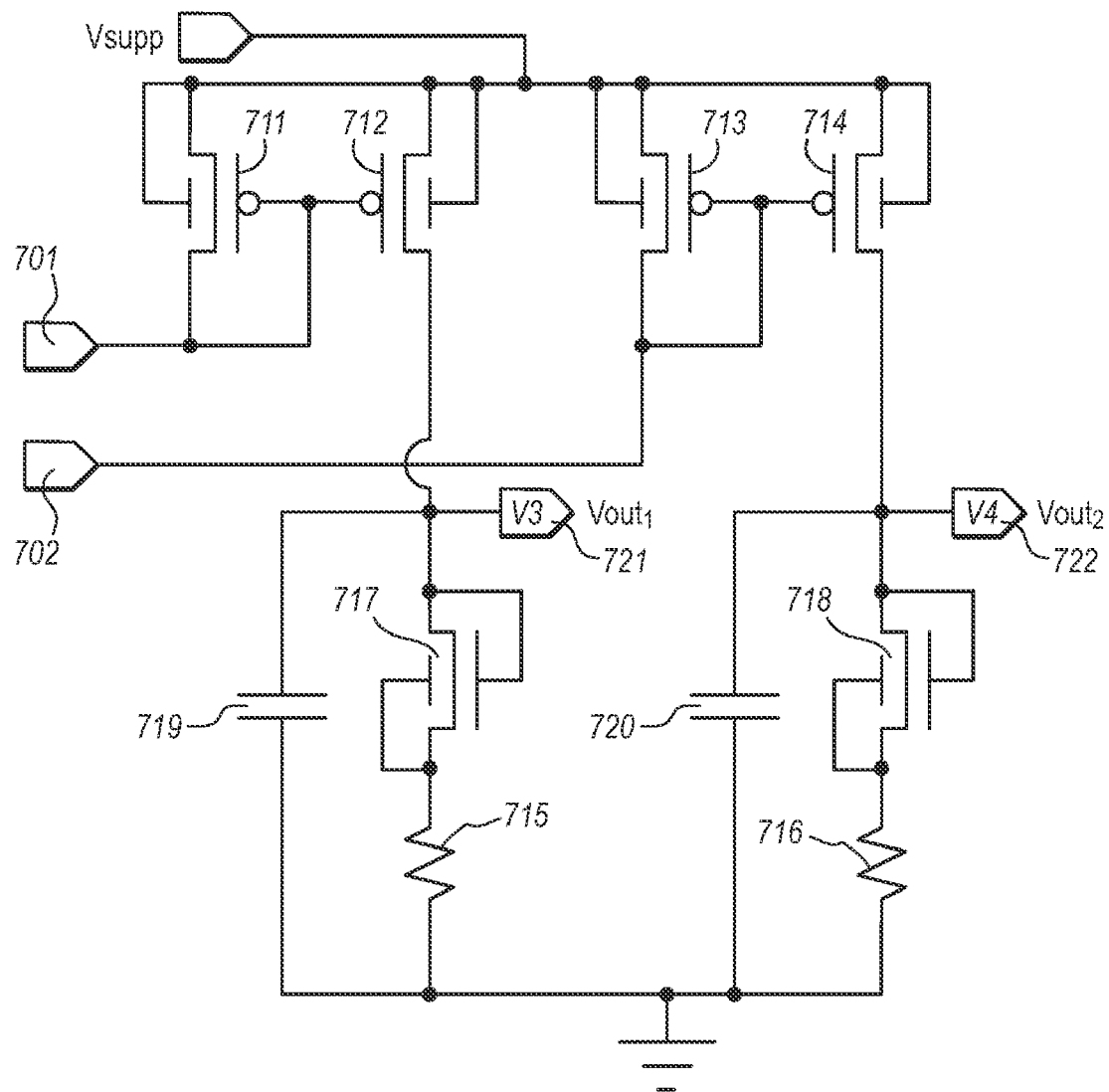
FIG. 7 illustrates a current-voltage converter having output filtering for improved common mode rejection at high frequency and additional transistors for gain accuracy in accordance with embodiments of the present invention.

FIG. 7 illustrates a current-voltage converter circuit 700 that may be used as an alternative to the circuit 400 of FIG. 4 to convert the differential current output signal to a differential voltage output signal. The current-voltage converter circuit 700 includes input terminals 701, 702, p-type transistors 711 through 714, resistors 715 and 716, and output terminals 721 and 722, which may be similar to the terminals 401, 402, p-type transistors 411 through 414, resistors 415 and 416, and output terminals 421 and 422, described above with respect to FIG. 4, with two additional changes.

First, additional n-type transistors 717 and 718 are configured as shown to allow for improved gain accuracy by compensating for limited transconductance of the amplifying transistors 213 and 214 of FIG. 2, or amplifying transistors 313 and 314 of FIG. 3.

Second, capacitors 719 and 720 are configured as shown, with one capacitor 719 capacitively coupling one of the output terminal 721 to ground, and the other capacitor 720 capacitively coupling the other output terminal 722 to ground. This allows for a low-pass filtering effect at the output terminals 721 and 722 thereby improving common mode rejection at high frequencies.

Figure 8:
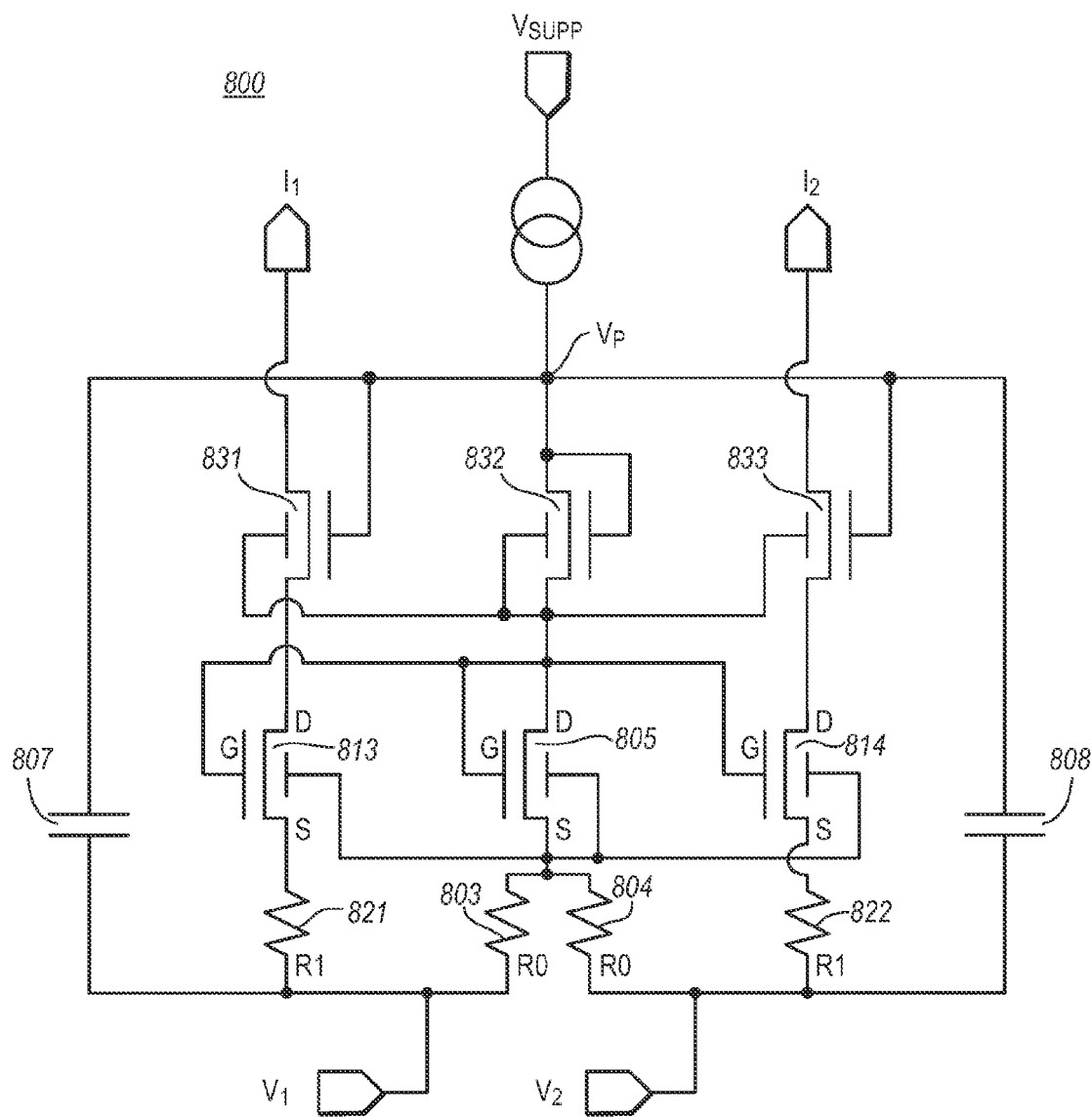
FIG. 8 illustrates the circuit of FIG. 2 with additional cascoded transistors for increasing the output impedance of the amplifying transistors thereby improving common mode rejection.

FIG. 8 illustrates a circuit 800 that is similar to the circuit 200 of FIG. 2 in some respects. In particular, the transistors 805, 813, 814, capacitors 807 and 808, and resistors 803, 804, 821 and 822 of FIG. 8 may be similar to the transistors 205, 213, 214, capacitors 207 and 208, and resistors 203, 204, 221 and 222 of FIG. 2. However, the circuit 800 provides a larger output impedance for the amplifying transistors 813 and 814 thereby providing perhaps higher common mode rejection. This may be accomplished by providing cascoded n-type transistors 831 and 833 for the respective amplifying transistors 813 and 814. The appropriate gate voltage for the cascoded transistors 831 and 833 may be provided by diode-connected transistor 832. In the circuit 200 of FIG. 2, the transistors 205, 213, 214 may sit within the n-well pocket 506 of FIG. 3, with the drain terminal of transistor 205 coupled to the pocket voltage $V_P$. In FIG. 8, the transistors 805, 813 and 814 may be included within the n-well pocket 506. However, the transistors 831, 832 and 833 may also be included within the n-well pocket, with the drain of the transistor 832 connected to the pocket voltage $V_P$.

As one further possible improvement on the capability to go negative, components (e.g., resistors or diode-like structures) can be stacked in order to shift the pocket voltage $V_P$ versus the input common mode voltage. This floating technology allows the substrate to go negative.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A differential operation circuit comprising:
    a first differential input node;
    a second differential input node;
    a common mode following circuit configured such that, when a first differential input signal is applied to the first differential input node and a second differential input signal is applied to the second differential input node, the common mode following circuit generates at least one signal that at least partially follows a common mode of the first and second differential input signals;
    a first differential output signal generation circuit configured to:
        A) be coupled to the first differential input node so as to receive at least a derivative of the first differential input signal when the first differential input signal is applied to the first differential input node, wherein the at least the derivative of the first differential input signal includes a common mode component;
        B) be coupled to the common mode following circuit so as to receive at least a derivative of a first signal generated by the common mode following circuit, the first signal generated by the common mode following circuit including a common mode component; and
        C) generate a first differential output signal that uses the common mode component of the at least the derivative of the first differential input signal and the common mode component of the at least the derivative of the first signal generated by the common mode following circuit in a manner that reduces a common mode component of the first differential output signal; and
    a second differential output signal generation circuit configured to:
        A) be coupled to the second differential input node so as to receive at least a derivative of the second differential input signal when the second differential input signal is applied to the second differential input node, wherein the at least the derivative of the second differential input signal includes a common mode component;
        B) be coupled to the common mode following circuit so as to receive at least a derivative of a second signal generated by the common mode following circuit, the second signal generated by the common mode following circuit including a common mode component; and
        C) generate a second differential output signal that uses the common mode component of the at least the derivative of the second differential input signal and the common mode component of the at least the derivative of the second signal generated by the common mode following circuit in a manner that reduces a common mode component of the second differential output signal.

2. A differential operation circuit in accordance with claim 1, wherein the first signal generated by the common mode following circuit, and the second signal generated by the common mode following circuit, are the same signal.

3. A differential operation circuit in accordance with claim 1, wherein the common mode following circuit comprises:
    a current source or sink that provides current to, or receives current from, an intermediate node;
    a first resistor coupled between the first differential input node and the intermediate node that receives current from or provides current to the current source or sink; and
    a second resistor coupled between the second differential input node and the intermediate node that receivers current from or provides current to the current source or sink.

4. A differential operation circuit in accordance with claim 3, wherein the first and second resistors are matched.

5. A differential operation circuit in accordance with claim 3, wherein the first and second resistors are not matched.

6. A differential operation circuit in accordance with claim 3, wherein the common mode following circuit further comprises:

a diode coupled to be forward biased between the current source or sink and the intermediate node.

7. A differential operation circuit in accordance with claim 6, wherein
the diode is a diode-connected nMOS transistor,
the current source or sink is a current source,
the first differential output signal generation circuit comprises a first nMOS transistor having a gate terminal connected to a drain and gate terminal of the diode-connected nMOS transistor, having a source terminal connected to the first differential input node, and having a drain terminal connected to a first differential current output node; and
the second differential output signal generation circuit comprises a second nMOS transistor having a gate terminal connected to a drain and gate terminal of the diode-connected nMOS transistor, having a source terminal connected to the second differential input node, and having a drain terminal connected to a second differential current output node.

8. A differential operation circuit in accordance with claim 7,
wherein the first differential output signal generation circuit further comprises a third resistor coupled between the source terminal of the first nMOS transistor, and the first differential input node; and
wherein the second differential output signal generation circuit further comprises a fourth resistor coupled between the source terminal of the second nMOS transistor and the second differential input node, wherein the third resistor and the fourth resistor are matched.

9. A differential operation circuit in accordance with claim 7,
wherein the first differential output signal generation circuit further comprises a third resistor coupled between the source terminal of the first nMOS transistor, and the first differential input node; and
wherein the second differential output signal generation circuit farther comprises a fourth resistor coupled between the source terminal of the second nMOS transistor and the second differential input node, wherein the third resistor and the fourth resistor are not matched.

10. A differential operation circuit in accordance with claim 7, wherein the common mode following circuit farther comprises:
a first capacitor coupled between the drain terminal of the first nMOS transistor and the first different input node; and
a second capacitor coupled between the drain terminal of the second nMOS transistor and the second differential input node.

11. A differential operation circuit in accordance with claim 10, further comprising:
a current to voltage conversion circuit coupled to the first and second current output nodes and configured to convert differential current signals present on the first and second current output nodes into a differential output voltage signal.

12. A differential operation circuit in accordance with claim 6, further comprising:
a current to voltage conversion circuit coupled to the first and second current output nodes and configured to convert differential current signals present on the first and second current output nodes into a differential output voltage signal.

13. A differential operation circuit in accordance with claim 6, wherein
the diode is a diode-connected pMOS transistor,
the current source or sink is a current sink,
the first differential output signal generation circuit comprises a first pMOS transistor having a gate terminal connected to a drain and gate terminal of the diode-connected pMOS transistor, having a source terminal connected to the first differential input node, and having a drain terminal connected to a first differential current output node; and
the second differential output signal generation circuit comprises a second pMOS transistor having a gate terminal connected to a drain and gate terminal of the diode-connected pMOS transistor, having a source terminal connected to the second differential input node, and having a drain terminal connected to a second differential current output node.

14. A differential operation circuit in accordance with claim 13,
wherein the first differential output signal generation circuit further comprises a third resistor coupled between the source terminal of the first pMOS transistor, and the first differential input node; and
wherein the second differential output signal generation circuit farther comprises a fourth resistor coupled between the source terminal of the second pMOS transistor and the second differential input node, wherein the third resistor and the fourth resistor are matched.

15. A differential operation circuit in accordance with claim 13,
wherein the first differential output signal generation circuit further comprises a third resistor coupled between the source terminal of the first pMOS transistor, and the first differential input node; and
wherein the second differential output signal generation circuit farther comprises a fourth resistor coupled between the source terminal of the second pMOS transistor and the second differential input node, wherein the third resistor and the fourth resistor are not matched.

16. A differential operation circuit in accordance with claim 13, wherein the common mode following circuit farther comprises:
a first capacitor coupled between the drain terminal of the first pMOS transistor and the first different input node; and
a second capacitor coupled between the drain terminal of the second pMOS transistor and the second differential input node.

17. A differential operation circuit in accordance with claim 16, further comprising:
a current to voltage conversion circuit coupled to the first and second current output nodes and configured to convert differential current signals present on the first and second current output nodes into a differential output voltage signal.

18. A differential operation circuit in accordance with claim 12, further comprising:
a current to voltage conversion circuit coupled to the first and second current output nodes and configured to convert differential current signals present on the first and second current output nodes into a differential output voltage signal.

* * * * *

UNITED STATES PATENT AND TRADEMARK OFFICE
CERTIFICATE OF CORRECTION

PATENT NO.         : 7,589,591 B2
APPLICATION NO.    : 11/841627
DATED              : September 15, 2009
INVENTOR(S)        : Jean-Paul Eggermont It is certified that error appears in the above-identified patent and that said Letters Patent is hereby corrected as shown below:

Column 6
Line 4, change "of" to --are--

Column 7
Line 12, change "shown" to --show--
Line 63, change "41 1" to --411--

Signed and Sealed this

Twenty-eighth Day of September, 2010

David J. Kappos
*Director of the United States Patent and Trademark Office*